(12) United States Patent
Feller

(10) Patent No.: US 8,433,965 B2
(45) Date of Patent: Apr. 30, 2013

(54) METHOD AND APPARATUS FOR OBTAINING COEFFICIENTS OF A FRACTIONALLY-SPACED EQUALIZER

(75) Inventor: Marc Feller, Long Beach, CA (US)

(73) Assignee: Quantum Corporation, San Jose, CA (US)

( * ) Notice: Subject to any disclaimer, the term of this patent is extended or adjusted under 35 U.S.C. 154(b) by 318 days.

(21) Appl. No.: 12/880,740

(22) Filed: Sep. 13, 2010

(65) Prior Publication Data

US 2012/0066561 A1    Mar. 15, 2012

(51) Int. Cl.
*G06F 11/00* (2006.01)
*H03M 13/00* (2006.01)

(52) U.S. Cl.
USPC .......................................... 714/746; 714/817

(58) Field of Classification Search .............. 714/746, 714/817; 341/150; 708/313
See application file for complete search history.

(56) References Cited

U.S. PATENT DOCUMENTS

| | | | | |
|---|---|---|---|---|
| 5,717,618 A | * | 2/1998 | Menkhoff et al. | ............. 708/313 |
| 6,922,555 B1 | * | 7/2005 | Mohindra | ..................... 455/314 |
| 6,993,673 B2 | * | 1/2006 | Greiss et al. | .................. 713/500 |
| 7,382,292 B1 | * | 6/2008 | Reial | ................................ 341/61 |
| 7,421,017 B2 | | 9/2008 | Takatsu | |
| 7,961,830 B2 | * | 6/2011 | Okamura et al. | ............. 375/355 |

OTHER PUBLICATIONS

Hanumolu et al., A wide tracking range clock and data recovery circuit, Feb. 2008, IEEE, Journal on Solid-State Circuit, vol. 43, No. 2, p. 425-439.*
Schmidt et al., Parelle architecture of an all digital timing recovery scheme for high speed receivers, 2010, IEEE, p. 31-34.*

* cited by examiner

*Primary Examiner* — Shelly A Chase
(74) *Attorney, Agent, or Firm* — Roeder & Broder LLP; James P. Broder

(57) ABSTRACT

A digital data recovery system for converting a suboptimal signal into a converted signal that closely approximates an original signal includes a first data filter, a first interpolator and a second interpolator. The first data filter filters the suboptimal signal to generate a first filtered signal. The first interpolator receives the first filtered signal and generates a first interpolated signal. Substantially concurrently, the second interpolator receives the suboptimal signal and generates a second interpolated signal. The digital data recovery system may further comprise a second data filter that receives the second interpolated signal and generates a second filtered signal. Further, the first data filter can include a set of first coefficients and the second data filter can include a set of second coefficients. Moreover, the second coefficients can be updated and subsequently transformed in order to update the first coefficients.

32 Claims, 5 Drawing Sheets

METHOD AND APPARATUS FOR OBTAINING COEFFICIENTS OF A FRACTIONALLY-SPACED EQUALIZER

BACKGROUND

Data coming from tape (or disk) is usually malformed due to a variety of effects, among them offset and rolloff. In the former, the data is not centered about its ideal values, and in the latter, there is insufficient energy at high frequencies. The result is usually a severe degradation in signal quality, whether measured as SINR (signal-to-noise ratio) or BER (bit error rate). By way of example, in a typical arrangement, an original signal, i.e. a high quality signal, is initially recorded onto a storage medium, such as disk, tape, optical or other digital data storage medium. Unfortunately, often only a suboptimal signal is obtainable from the storage medium. Accordingly, there is a need for a system and method for cleaning up the suboptimal signal so that it can match as nearly as possible the original signal.

Digital data recovery systems, e.g., disk, tape, optical, or other digital data recovery systems, are designed to address these deficiencies, with the ultimate output being a data stream, usually but not necessarily of three levels, which is properly centered and in which the high-frequency energy has been boosted. Previous attempts to address the above-noted problems involved the use of direct feedback for adaptive filter training, linear interpolation, and/or reverse interpolation.

Digital data recovery systems typically receive oversampled data, that is, data sampled at a rate $1/T_s$ that is slightly higher than the bit rate $1/T$, to allow for speed variations in the source. A Fractionally-Spaced Equalizer, or "FSE", which is a finite-impulse response filter, is generally used to equalize the oversampled data before it is delivered to a timing recovery unit. The timing recovery unit typically includes an interpolator, a slicer, a phase detector, a loop filter and an oscillator. This filter is often made adaptive, so that its coefficients adjust dynamically and continuously in response to changes in the input signal. In this case, the filter is called an Adaptive Fractionally-Spaced Equalizer, or "AFSE". However, direct extraction of an error signal in the oversampled domain is not possible, so the AFSE must be trained using an error signal fed back from the bit rate domain following the timing recovery unit. Further, AFSEs are known to suffer from a phenomenon called "tap wandering" which can cause them to become unstable. Additionally, while algorithms or other leakage mechanisms have previously been utilized to treat the problem of tap wandering, the results are known to be suboptimal. Still further, the adaptive hardware required to operate a continuously updating FSE/AFSE greatly increases the complexity of the digital data recovery channel.

SUMMARY

The present invention is directed toward a digital data recovery system for converting a suboptimal signal into a converted signal that closely approximates an original signal. In certain embodiments, the digital data recovery system comprises a first data filter, a first interpolator and a second interpolator. The first data filter filters the suboptimal signal to generate a first filtered signal. The first interpolator receives the first filtered signal and generates a first interpolated signal. Additionally, the second interpolator receives the suboptimal signal and generates a second interpolated signal. In some embodiments, the digital data recovery system may further comprise a second data filter that receives the second interpolated signal and generates a second filtered signal.

In one embodiment, the digital data recovery system further comprises a slicer that receives the first interpolated signal and generates a sliced signal. In such embodiment, the digital data recovery system can further comprise a summing junction that compares the second filtered signal and the sliced signal and determines a path signal error based on the difference between the second filtered signal and the sliced signal. Further, in this embodiment, the first data filter can include a set of first coefficients and the second data filter can include a set of second coefficients. The path signal error is then utilized to update the second coefficients. Moreover, the second coefficients are subsequently transformed to update the first coefficients.

In another embodiment, the digital data recovery system further comprises a detector that receives the first interpolated signal and generates a detected signal. Additionally, the digital data recovery system can further comprise a recoder that receives the detected signal and generates a recoded signal. In such embodiment, the digital data recovery system can further comprise a summing junction that compares the second filtered signal and the recoded signal and determines a path signal error based on the difference between the second filtered signal and the recoded signal. Further, in such embodiment, the first data filter can include a set of first coefficients and the second data filter can include a set of second coefficients. The path signal error is then utilized to update the second coefficients. Moreover, the second coefficients are subsequently transformed to update the first coefficients.

The present invention is further directed toward a method for converting a suboptimal signal into a converted signal that closely approximates an original signal.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
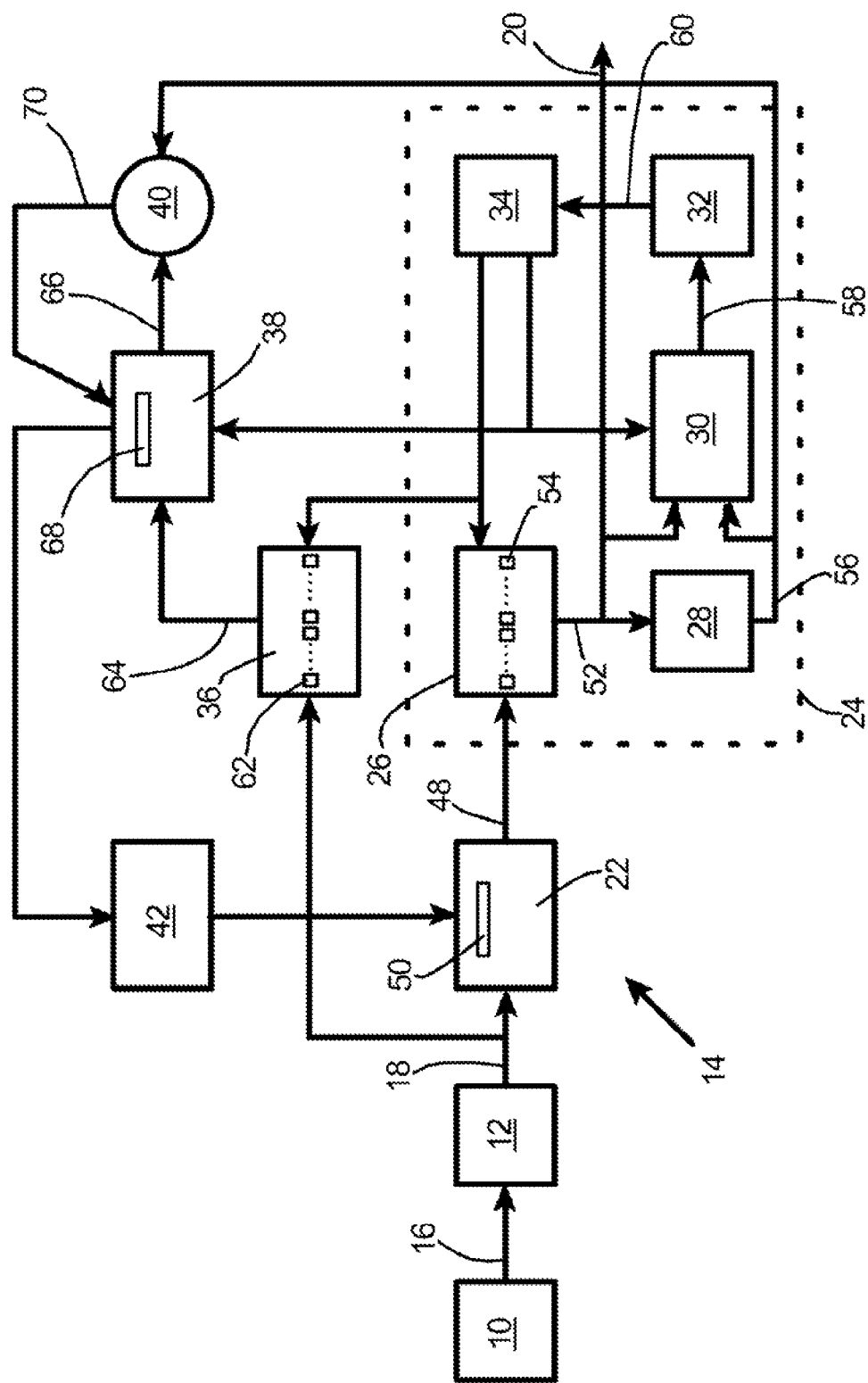
FIG. 1 is a schematic diagram of an original signal source, a storage medium and an embodiment of a digital data recovery system having features of the present invention.

FIG. 1 is a schematic diagram of an original signal source 10, a storage medium 12 and an embodiment of a digital data recovery system 14 having features of the present invention. The original signal source 10 provides an original signal 16, which can be recorded onto the storage medium 12, such as disk, tape, optical, or other digital data storage medium. The storage medium 12 can be included as part of a media library 384 (illustrated in FIG. 3), which can include a plurality of storage media 12. Subsequently, when the signal or data is retrieved from the storage medium 12, the signal or data is no longer in its original, or clean, form. Stated another way, the signal or data that is retrievable from the storage medium 12 is a suboptimal signal 18 that includes noise, asymmetries and/or other impurities that were not included as part of the original signal 16. Accordingly, the suboptimal signal 18 is sent to the digital data recovery system 14 in order to clean up the suboptimal signal 18 so as to generate a converted signal 20, or output signal, that is approximately equal or substantially similar to the original signal 16.

The digital data recovery system 14 can be incorporated as part of the storage library or the digital data recovery system 14 can be separate from, although utilized with, the storage library. Still alternatively, the digital data recovery system can be utilized with or incorporated into a storage system other than a storage library. In various embodiments, these described portions of the digital data recover system 14 can be implemented as hardware, a combination of hardware and firmware, and/or a combination of hardware and software.

The design of the digital data recovery system 14 can be varied. As illustrated in FIG. 1, the digital data recovery system 14 includes a first data filter 22, e.g., a fractionally-spaced equalizer, and a timing recovery unit 24 (illustrated as a dashed box). Further, the timing recovery unit 24 includes a first interpolator 26, a slicer 28, a phase detector 30, a loop filter 32, and an oscillator 34, e.g., a numerically-controlled oscillator. Additionally, as illustrated in FIG. 1, this embodiment of the digital data recovery system 14 further includes a second interpolator 36, a second data filter 38, e.g., an adaptive FIR filter, a summing junction 40, and a coefficient transformer 42.

As an overview, the digital data recovery system 14 provides an improved system and method for recovering or cleaning up the suboptimal signal 18 such that the converted signal 20 is substantially similar to the original signal 16. More specifically, in the present invention, the suboptimal signal 18 is directed on a first path and a separate second path before the signal on each path is directed to the summing junction 40. Each path is described in greater detail below. In certain embodiments, on the first path, the suboptimal signal 18 is directed to one or more of the first data filter 22 and the timing recovery unit 24 before being directed to the summing junction 40; and, on the second path, the suboptimal signal 18 is directed to one or more of the second interpolator 36 and the second data filter 38 before being directed to the summing junction 40. Additionally, in some embodiments, the suboptimal signal 18 is directed on the first path concurrently with the suboptimal signal 18 being directed on the second path. Stated another way, the suboptimal signal 18 can be substantially simultaneously and/or continuously directed on each of the first path and the second path.

Initially, in operation of the digital data recovery system 14, the suboptimal signal 18 is directed along the first path to the first data filter 22. In certain embodiments, the first data filter 22 oversamples the data. In particular, in certain embodiments, the first data filter 22 operates at a sampling interval $T_s$ that is somewhat shorter than a cell interval T of the suboptimal signal 18, which is the interval at which we would expect the suboptimal signal 18 to ultimately be sampled, in order to provide a degree of margin for speed variations. Stated another way, the first data filter 22 receives an oversampled suboptimal signal 18, as the suboptimal signal sample rate $1/T_s$ is slightly higher than the bit rate, or cell interval rate, of $1/T$. It should be noted that the bit rate, or cell interval rate of $1/R$ is the rate at which we would expect the suboptimal signal 18 to ultimately be sampled. An oversampling ratio, $T/T_s$, which is the ratio of the sample rate $1/T_s$ divided by the cell interval rate $1/T$, in principal, may have any value greater than one. In certain embodiments, the oversampling ratio, $T/T_s$, can fall within the range of approximately 1.05 to approximately 1.50. Alternatively, the oversampling ratio, $T/T_s$, may be greater than 1.50 or between 1.00 and 1.05.

The first data filter 22 equalizes the suboptimal signal 18 to generate a first filtered signal 48. In particular, the first data filter 22 processes the suboptimal signal 18 by removing noise, asymmetries and/or other impurities of the suboptimal signal 18 to generate the first filtered signal 48. In some embodiments, because the suboptimal signal 18 is being oversampled by the first data filter 22, the first data filter 22 can include a fractionally spaced equalizer, or FSE. In such embodiments, the first data filter 22 is referred to as fractionally spaced because the suboptimal signal 18 that is the input signal to the first data filter 22 is oversampled and is not running at the final rate at which it would be expected to run.

The first data filter 22 includes a plurality of first coefficients 50. The purpose of the first coefficients 50 is to at least partially if not completely correct the problems of offset and/or rolloff that can occur when a signal or data is taken from the storage medium 12. In this embodiment, the first coefficients 50 are periodically updated, via the feedback as described in detail herein, in order to achieve a first filtered signal 48 that is a closer approximation of the original signal 16. In particular, with the first coefficients 50, the first data filter 22 cleans up the suboptimal signal 18, e.g., performs waveshaping of the suboptimal signal 18, and transforms it into the first filtered signal 48, which can be a suitably good approximation of the target waveform of the original signal 16. It is assumed that before operations begin, the first data filter 22 includes a set of first coefficients 50 capable of delivering an approximation of the ideal response. These first coefficients 50 may be obtained from the input signal in an offline manner, as, for example, by means of the autocorrelation method described in Orfanidis, S. J., "Optimum Signal Processing", $2^{nd}$ Edition, MacMillan, 1988, Section 5.14.

It should be noted that the first data filter 22, as illustrated herein, is not continuously adaptive because the first coefficients 50 are only utilized intermittently and not continuously. With this design, the digital data recovery system 14 inhibits instability due to tap wandering; it improves the suboptimal results which have occurred in previous attempts to address the problems of offset, rolloff and tap wandering; and/or it reduces complexity by removing the necessity for additional adaptive hardware, e.g., additional multipliers and adders, which may otherwise exist in a continuously updating filter.

Continuing along the first path, subsequent to the first data filter 22 generating the first filtered signal 48 from the suboptimal signal 18, the first filtered signal 48 is then directed to the timing recovery unit 24. In one embodiment, the timing recovery unit 24 includes the first interpolator 26, the slicer 28, the phase detector 30, the loop filter 32, and the oscillator 34. In general, the timing recovery unit 24 is a control system that generates an output signal having a phase that is related to the phase of the input "reference" signal. Stated another way, the timing recovery unit 24 reduces the oversampling rate down to the standard cell rate or bit rate so that the suboptimal signal 18 is synchronized with and/or approaches the original signal 16. More particularly, the timing recovery unit 24 compares the phase of the input signal with a phase signal derived from the oscillator 34 and adjusts the frequency of the oscillator 34 to more closely match the phases. Frequency is the derivative of phase; thus, keeping the input and output phase in lock step implies keeping the input and output frequencies in lock step. Consequently, the timing recovery unit 24 can track an input frequency or it can generate a frequency that is a multiple of the input frequency.

The first interpolator 26 is a device that constructs new data points within the range of a discrete set of known data points. Stated another way, the first interpolator 26 takes a discrete set of known data points, and constructs a function which closely fits those data points. For example, in certain embodiments the signal that is directed to the first interpolator 26 includes a succession of data samples that are taken from a continuous off-media waveform. Unfortunately, the data samples that are directed to the first interpolator 26 are not typically located at the peaks and zeros of the waveform as desired. Accordingly, the first interpolator 26 takes the data samples, and divides the distance between the data samples into a series of smaller intervals along the waveform, and then chooses the interval most near the peaks and zeros so as to effectively locate the peaks and zeros along the waveform.

In the embodiment illustrated in FIG. 1, the first interpolator 26 receives the first filtered signal 48 from the first data filter 22 and converts the first filtered signal 48 into a first interpolated signal 52. In particular, the first interpolator 26 resamples the first filtered signal 48 at intervals of T to generate the first interpolated signal 52. The resampled values, i.e. the first interpolated signal 52, occur at intervals T rather than $T_s$ as does the first filtered signal 48. The resampling intervals are determined by the oscillator 34 driven in turn by a filtered phase error of the first interpolated signal 52. More particularly, the oscillator 34 provides a gate in each cell wherein an interpolation is to be made, together with an offset specifying the distance into the cell in which the interpolation should take place. The filtered phase error is determined using a decision-directed method, which is a function of the difference between each interpolated sample and its ideal value.

In the embodiment illustrated in FIG. 1, the first interpolator 26 includes a plurality of first stages 54. The plurality of first stages 54, e.g.; delay stages, are utilized so that several incoming signal samples are spread out over the first stages 54. The output from each first stage 54, after passing through a multiplier, feeds the output of the first data filter 22.

In one embodiment, the first stages 54 include a pair of first center stages. Between the first center stages is a succession of points at which an interpolation might be made. By way of example, the first interpolator 26 may have ten stages with sixty-four points between the two first center stages. At each gate, the first interpolator 26 learns from the offset (as supplied by the oscillator 34) which of the sixty-four points to output, and the resulting data value, or first interpolated signal 52, is passed on to the slicer 28. In certain non-exclusive alternative embodiments, the first interpolator 26 can be another suitable type of interpolator. For example, the first interpolator 26 could be a parabolic or cubic form interpolator, or another suitable type of interpolator.

The output, i.e. the first interpolated signal 52, of the first interpolator 26 has many different values that are subsequently sliced within the slicer 28 to generate a sliced signal 56. In one embodiment, the first interpolated signal 52 includes three different values and the slicer 28 makes an estimate of which of the three values is the most appropriate or accurate, and that value makes up the sliced signal 56. In one non-exclusive embodiment, the first filtered signal 48 from the first data filter 22 can have a continuous range of levels which might be from −127 to +128. In such embodiment, if the first interpolator 26 has done its job properly, the range of levels can fall into a small number of discrete levels, typically three levels, which might be around −80 . . . −48, −16 . . . 16, +48 . . . 80. The slicer 28 selects one of these from each sample, making a decision of either −64, 0, or +64 in this example. The output of the slicer 28 is then referred to as the sliced signal 56.

The first interpolated signal 52 and the sliced signal 56 are then fed into the phase detector 30, along with feedback from the oscillator 34, as described below. For example, in one non-exclusive embodiment, the phase detector 30 can be a Muller-Mueller detector. The phase detector 30 is a negative feedback system that controls the oscillator 34 such that the phase difference between the two inputs, i.e. the first interpolated signal 52 and the sliced signal 56, is held constant. In certain embodiments, the phase detector 30 can include a frequency mixer or analog multiplier circuit that generates a voltage signal which represents the difference between the first interpolated signal 52 and the sliced signal 56. Stated another way, the phase detector 30 compares the first interpolated signal 52 and the sliced signal 56 and produces an error signal 58 which is proportional to their phase difference.

The output from the phase detector 30, i.e. the error signal 58, is then fed into the loop filter 32, which is utilized to round off the error signal 58 from the phase detector 30, i.e. to generate a filtered error signal 60, which is then used to drive the oscillator 34.

As noted above, the function of the oscillator 34 is to determine where in each cell of the first interpolator 26, i.e. the gate and the offset, the signal or data interpolation should be made. Stated another way, the oscillator 34 determines an output frequency that is fed back to the first interpolator 26, as part of a negative feedback loop. Assuming that initially the oscillator 34 is at approximately the same frequency as the original signal 16, then if the phase from the oscillator 34 falls behind that of the original signal 16, the phase detector 30 changes the control voltage of the oscillator 34 so that it speeds up. Likewise, if the phase from the oscillator 34 creeps ahead of the original signal 16, then the phase detector 30 changes the control voltage to slow down the oscillator 34. Since initially the oscillator 34 may be far from the frequency of the original signal 16, the phase detector 30 may also respond to frequency differences, to change the control voltage in order to correct the frequency of the oscillator 34. Moreover, in operation, if the output frequency of the oscillator 34 drifts, the error signal 58 will increase, thereby driving the oscillator 34 frequency in the opposite direction in order to reduce the error accordingly.

In one embodiment, the oscillator 34 can be a numerically-controlled oscillator (NCO), which is a digital signal generator that creates a synchronous, discrete-time, discrete-valued representation of a waveform, usually sinusoidal. Alternatively, the oscillator 34 can be another suitable type of oscillator.

It should be noted that the gate information, as provided by the oscillator 34, is also fed back into the phase detector 30 in order to prevent maladaptation. For example, if there is no gate at a particular time, then the phase detector 30 is inhibited from adapting, as the phase detector 30 would otherwise be adapting to bad data.

Additionally, the sliced signal 56 is directed to the summing junction 40 to be compared with the signal generated from the second path, as will be discussed below. It is the slicer output, i.e. the sliced signal 56, that is compared to the second interpolator output (also, in the example, around −80 . . . −48, −16 . . . 16, +48 . . . 80 or so) to determine the error, as will be discussed in greater detail below.

Concurrently with the suboptimal signal 18 being directed along the first path, the suboptimal signal 18 is also directed along the second path, initially being directed to the second interpolator 36. More particularly, in one embodiment, the suboptimal signal 18 can be processed by the second interpolator 36 concurrently with the first filtered signal 48 being processed by the first interpolator 26. Additionally, the second interpolator 36 can also receive the suboptimal signal 18 at the same suboptimal signal sample rate $1/T_s$, i.e. at the same oversampling rate, as the suboptimal signal 18 is received by the first data filter 22. Alternatively, the second interpolator 36 can receive the suboptimal signal 18 at a sample rate that is somewhat different than the sample rate at which the suboptimal signal 18 is received by the first data filter 22.

In one embodiment, the second interpolator 36 can be substantially similar in design and function to the first interpolator 26. For example, in this embodiment, the second interpolator 36 receives the suboptimal signal 18 from the storage medium 12 and converts that signal into a second interpolated signal 64. Additionally, the second interpolator 36 can include a plurality of second stages 62, e.g., delay stages, which are utilized so that several incoming signal samples are spread out over the second stages 62. The output from each second stage 62, after passing through a multiplier, feeds the output of the second data filter 38.

In one embodiment, the second stages 62 include a pair of second center stages. Between the second center stages is a succession of points at which an interpolation might be made. By way of example, the second interpolator 36 may have eight second stages with sixty-four points between the two second center stages. The gate and offset information is again supplied by the oscillator 34. Further, at each gate, the second interpolator 36 learns from the offset which of the sixty-four points to output, and the resulting data value, or the second interpolated signal 64, is subsequently directed to the second data filter 38: In certain non-exclusive alternative embodiments, the second interpolator 36 can be another type of interpolator. For example, the second interpolator 36 can be a parabolic or cubic form interpolator, or another suitable type of interpolator.

In one embodiment, the ratio of the number of first stages 54 to the number of second stages 62 can be approximately the same as the oversampling rate (T/Ts). For example, since the suboptimal signal 18 that is directed to the second interpolator 36 and then to the second data filter 38 is the same as the suboptimal signal 18 that is directed to the first data filter 22, the second interpolated signal 64 reaches the second data filter 38 sooner than the first filtered signal 48 comes out of the first data filter 22, so that there is an offset in timing between the two. By making the ratio of the number of first stages 54 to the number of second stages 62 approximately the same as the oversampling rate, this offset in timing can be corrected for. More particularly, in such embodiment, the responses of the two data filters 22, 38 are most alike, with the large values near the center stages and the smaller values near the end stages of each interpolator 26, 36 corresponding to one another to the extent possible. Alternatively, the ratio of the number of first stages 54 to the number of second stages 62 can be different than the oversampling rate.

Although in certain embodiments the second interpolator 36 can function in essentially the same manner as the first interpolator 26, it should be noted that the second interpolated signal 64 exiting the second interpolator 36 will probably differ from the first interpolated signal 52 exiting the first interpolator 26 because the input signal is different. Stated another way, because the suboptimal signal 18 is directed to the second interpolator 36 without first being filtered or equalized, the second interpolated signal 64 will probably be somewhat different than the first interpolated signal 52.

The second data filter 38 receives the second interpolated signal 64 from the second interpolator 36. The second data filter 38 can be somewhat similar or identical in function to the first data filter 22. For example, the second data filter 38 equalizes the second interpolated signal 64 to generate a second filtered signal 66. In particular, the second data filter 38 processes the second interpolated signal 64 by removing noise, asymmetries and/or other impurities to generate the second filtered signal 66. In some embodiments, because the suboptimal signal 18 is being oversampled by the first data filter 22, the first data filter 22 can include a fractionally spaced equalizer (FSE). In such embodiments, the first data filter 22 is referred to as fractionally spaced because the suboptimal signal 18 that is the input signal to the first data filter 22 is oversampled and is not running at the final rate at which it would be expected to run.

The second data filter 38 includes a plurality of second coefficients 68. In particular, with the second coefficients 68, the second data filter 38 cleans up the second interpolated signal 64 and transforms it into the second filtered signal 66, which can be a suitably good approximation of the target waveform of the original signal 16.

Additionally, it should be noted that the gate information, as provided by the oscillator 34, is also fed into the second data filter 38 in order to prevent maladaptation. For example, if there is no gate at a particular time, then the second data filter 38 is inhibited from adapting, as the second data filter 38 would otherwise be adapting to bad data.

The second filtered signal 66 is then directed to the summing junction 40 where the second filtered signal 66 is compared to the sliced signal 56 generated by the slicer 28 as the signal was directed along the first path. Thus, the output of the second path, i.e. the second filtered signal 66, is compared to the output of the first path, i.e. the sliced signal 56, at the summing junction 40. Accordingly, the summing junction 40 determines a path signal error 70 based on the difference between the second filtered signal 66 and the sliced signal 56.

The path signal error 70 is subsequently fed back into the second data filter 38 in order to adjust the second coefficients 68 that are utilized by the second data filter 38 whenever the gate is active. In one embodiment, the second coefficients 68 are continuously adapted so as to reduce the path error signal 70. Accordingly, the second data filter 38 can be referred to as an adaptive finite impulse response filter (or "adaptive FIR" filter or "AFIR").

The coefficient transformer 42 periodically transforms the second coefficients 68 from the second data filter 38 so that they can be usable to periodically update the first coefficients 50 in the first data filter 22. In one embodiment, the second coefficients 68 of the second data filter 38, which have been formed with a certain response at interval T, are periodically sampled and transformed into a new set of first coefficients 50 within the coefficient transformer 42, such that the new set of first coefficients 50 have a similar response when operating at interval $T_s$. The resulting new set of first coefficients 50 is then used to update the first data filter 22.

In one embodiment, the coefficient transformer 42 transforms the second coefficients 68 into the new set of first coefficients 50 utilizing a method as described below. First, the method assumes that there are M second coefficients in the second data filter, $C_{src}$, and that there are N coefficients in the first data filter, $C_{tar}$. Then, assuming $$T_s = M/N \qquad \text{(Eq. 1.1)}$$

the $N^{th}$ coefficient of $C_{tar}$ is obtained by the equation $$C_{tar}(N) = \sum_{j=1}^{M} C_{src}(j) \cdot \text{sinc}(iT_s - j) \quad \text{(Eq. 1.2)}$$

which calculates the influence of all the coefficients of $C_{src}$ on each coefficient of $C_{tar}$ by means of the sin c function (sometimes also referred to as the "brick wall function")

$$\text{sinc}(x) = \begin{cases} 1, & x = 0 \\ \dfrac{\sin(\pi x)}{\pi x}, & \text{otherwise.} \end{cases} \quad \text{(Eq. 1.3)}$$

However, in a typical digital data recovery system, $T_s$ is not constant over time, but in reality it wanders about the ideal fixed value of M/N due to speed variations in the storage medium 12 that is delivering the suboptimal signal 18. This, in turn, causes a phase shift in the second data filter 38, which can lead to suboptimal adaptation. Accordingly, by defining the ratio of the actual interval $T'_s$ to the nominal interval $T_s$ to be 1+Δ, the phase shift may be corrected by modifying (Eq. 1.2) to $$C_{tar}(N) = \sum_{j=1}^{M} C_{src}(j) \cdot \text{sinc}\left(\frac{iT_s}{1+\Delta} - j\right) \quad \text{(Eq. 1.4)}$$

which effectively compensates for the speed variations.

With the periodically updated first coefficients 50, the first data filter 22 and the timing recovery unit 24 are better able to approximate the original signal 16. Thus, the digital data recovery system 14 enables the generation of a converted signal 20 that more closely approximates the original signal 16.

Figure 2:
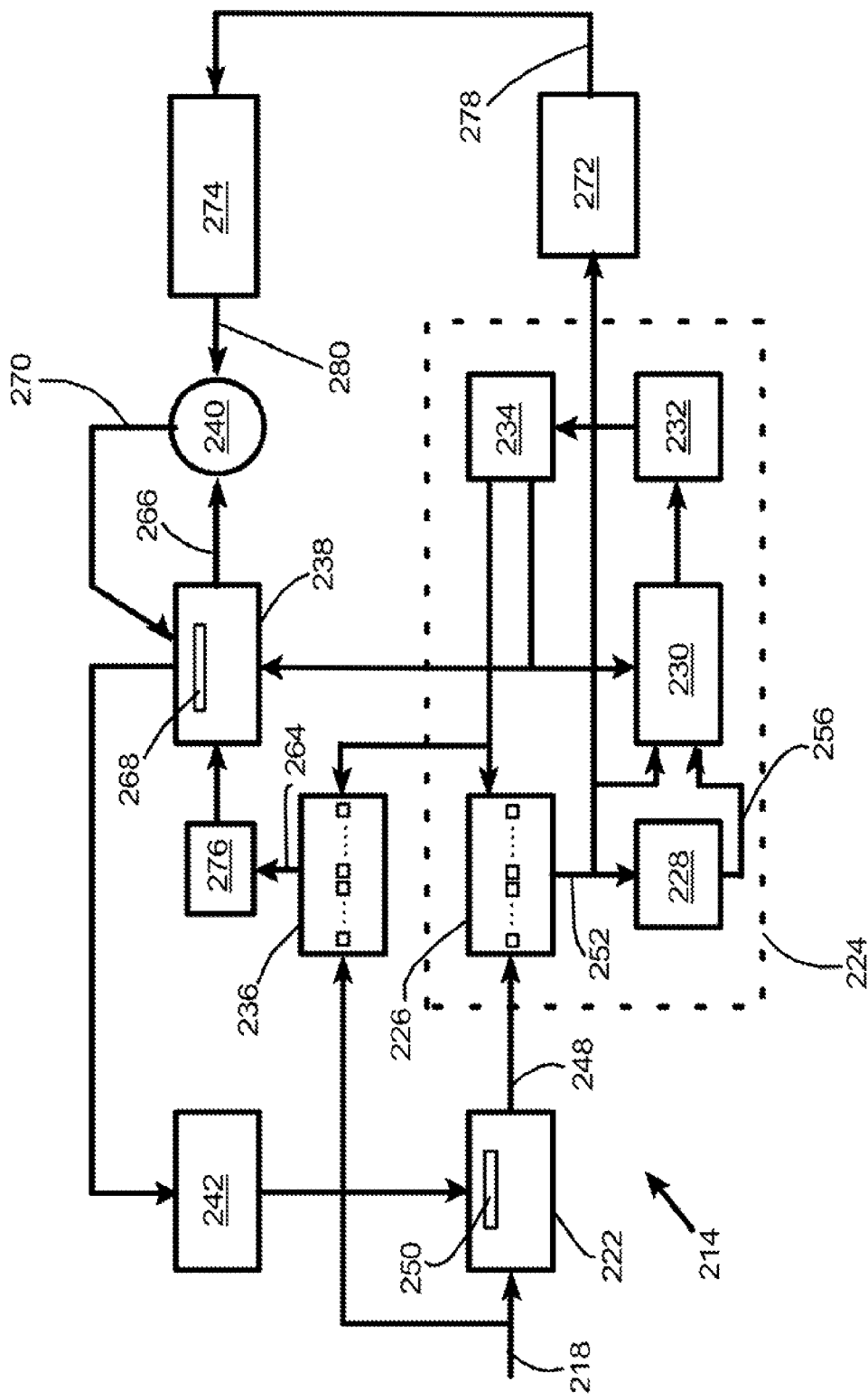
FIG. 2 is a schematic diagram of another embodiment of the digital data recovery system.

FIG. 2 is a schematic diagram of another embodiment of the digital data recovery system 214 having features of the present invention. In particular, the digital data recovery system 214 can again be utilized to receive a suboptimal signal 218 and to direct the suboptimal signal 218 along a first path and separately, and substantially simultaneously or concurrently, along a second path to generate a converted signal 220 that is approximately equal or substantially similar to the original signal 16 (illustrated in FIG. 1).

As illustrated in FIG. 2, the digital data recovery system 214 includes certain features in common with the digital data recovery system 14 illustrated in FIG. 1. For example, along the first path, the digital data recovery system 214 illustrated in FIG. 2 includes a first data filter 222, e.g., a fractionally-spaced equalizer, having a plurality of first coefficients 250, and a timing recovery unit 224 (illustrated as a dashed box) that are substantially similar to the first data filter 22, and the timing recovery unit 24 described above in relation to FIG. 1. More particularly, the timing recovery unit 224 includes a first interpolator 226, a slicer 228, a phase detector 230, a loop filter 232, and an oscillator 234 that are substantially similar to the first interpolator 26, the slicer 28, the phase detector 30, the loop filter 32, and the oscillator 34, respectively, described above in relation to FIG. 1. Additionally, along the second path, the digital data recovery system 214 includes a second interpolator 236 and a second data filter 238, e.g., an adaptive FIR filter, having a plurality of second coefficients 268, which are substantially similar to the second interpolator 36 and the second data filter 238, respectively, described above in relation to FIG. 1.

Additionally, as illustrated in FIG. 2, this embodiment of the digital data recovery system 214 further includes a detector 272, a recoder 274, a summing junction 240, a delay 276, and a coefficient transformer 242. The summing junction 240 and the coefficient transformer 242 are substantially similar to the summing junction 40 and the coefficient transformer 42, respectively, described above in relation to FIG. 1. However, in this embodiment, the detector 272 and the recoder 274 are effectively positioned between the timing recovery unit 224, i.e. the first interpolator 226, and the summing junction 240 along the first path. Further, in this embodiment, the delay 276 is positioned effectively between the second interpolator 236 and the second data filter 238 along the second path so that the timing of the data feeds are not impacted due to the passing of the first interpolated signal 252 through the detector 272 and the recoder 274.

Additionally, in this embodiment, the output from the slicer 228, i.e. the sliced signal 256, is only fed into the phase detector 230 as part of the feedback loop within the timing recovery unit 224, and the sliced signal 256 is no longer fed directly into the summing junction 240. As will be described in greater detail below, in this embodiment, the input into the summing junction 240 from the first path that takes the place of the sliced signal 256 is the output from the recoder 274.

As illustrated in this embodiment, the first interpolator 226 receives the first filtered signal 248 from the first data filter 222. Subsequently, the first interpolator 226 utilizes information from the feedback loop that is provided within the timing recovery unit 224 in order to generate the first interpolated signal 252. In one embodiment, the first interpolator 226 utilizes a method substantially similar to the first interpolator 26 as described in FIG. 1 in order to convert the incoming first filtered signal 248 into the output first interpolated signal 252.

Subsequently, as illustrated, in addition to the first interpolated signal 252 being directed further within the timing recovery unit 224 to the slicer 228, the first interpolated signal 252 is also directed out of the timing recovery unit 224 to the detector 272. The detector 272 performs a function somewhat similar to that of the slicer 228. In particular, in one embodiment, the first interpolated signal 252 may again include three different values and the detector 272, similar to the slicer 28 as described above and the slicer 228 as utilized herein, makes an estimate of which of the three values is the most appropriate or accurate, and that value is then referred to as a detected signal 278. In different embodiments, the detector 272 can be a Viterbi or Noise-Predictive Maximum Likelihood (NPML) detector, a BCJR detector, or any other detector capable of making high-quality decisions as to what is the appropriate or accurate value of what is provided in the first interpolated signal 252. Additionally, the detector 272 may inhibit any noise that is present in the suboptimal signal 218 from degrading the performance of the second data filter 238.

The detected signal 278 is then directed to the recoder 274, which converts the detected signal 278 into a recoded signal 280, which can more readily be compared with the second filtered signal 266 in the summing junction 240. For example, in certain embodiments, the detected signal 278 can include a series of 1's and 0's that are then converted into the recoded signal 280, which includes a series of +1's, 0's and −1's.

As noted above, along the second path, the delay 276 is effectively positioned between the second interpolator 236 and the second data filter 238 so that the timing of the data feeds into the summing junction 240 are not impacted due to the passing of the first interpolated signal 252 through the detector 272 and the recoder 274. In particular, after the second interpolator 236 receives the suboptimal signal 218 and converts the suboptimal signal 218 into the second interpolated signal 264, utilizing a similar method as described above, the second interpolated signal 264 is directed to the delay 276 so that the data feeds from the first path and the second path into the summing junction 240 can be in phase with each other. Thus, in this embodiment, the delay 276 is utilized to essentially match the timing delay that occurs due to the signal passing through the detector 272 along the first path.

After the delay 276 is utilized to effectively and appropriately slow down the processing of the second interpolated signal 264 along the second path, the second interpolated signal 264 is directed to the second data filter 238. The second data filter 238, similar to the previous embodiment, receives the second interpolated signal 264 from the second interpolator 236, and the second data filter 238 equalizes the second interpolated signal 264 to generate a second filtered signal 266. The second data filter 238 processes the second interpolated signal 264 by removing noise, asymmetries and/or other impurities to generate the second filtered signal 266.

Subsequently, the second filtered signal 266 is then directed to the summing junction 240 where the second filtered signal 266 is compared to the recoded signal 280 generated by the detector 272 and the recoder 274 as the signal was directed along the first path. Thus, the output of the second path, i.e. the second filtered signal 266, is compared to the output of the first path, i.e. the recoded signal 280, at the summing junction 240. Accordingly, the summing junction 240 determines a path signal error 270 based on the difference between the second filtered signal 266 and the recoded signal 280.

The path signal error 270 is subsequently fed back into the second data filter 238 in order to adjust the second coefficients 268 that are utilized by the second data filter 238 whenever the gate is active. In one embodiment, the second coefficients 268 are continuously adapted in order to reduce the path error signal 270.

The coefficient transformer 242, similar to the previous embodiment, periodically transforms the second coefficients 268 from the second data filter 238 so that they can be usable to periodically update the first coefficients 250 in the first data filter 222. In one embodiment, the second coefficients 268 of the second data filter 238, which have been formed with a certain response at interval T, are periodically sampled and transformed into a new set of first coefficients 250 within the coefficient transformer 242, such that the new set of first coefficients 250 have a similar response when operating at interval $T_s$. The resulting new set of first coefficients 250 is then used to update the first data filter 222.

Again, as with the embodiment illustrated in FIG. 1, with the periodically updated first coefficients 250, the first data filter 222 and the timing recovery unit 224 are better able to approximate the original signal 16. Thus, the digital data recovery system 214 enables the generation of a converted signal 220 that more closely approximates the original signal 16.

Figure 3:
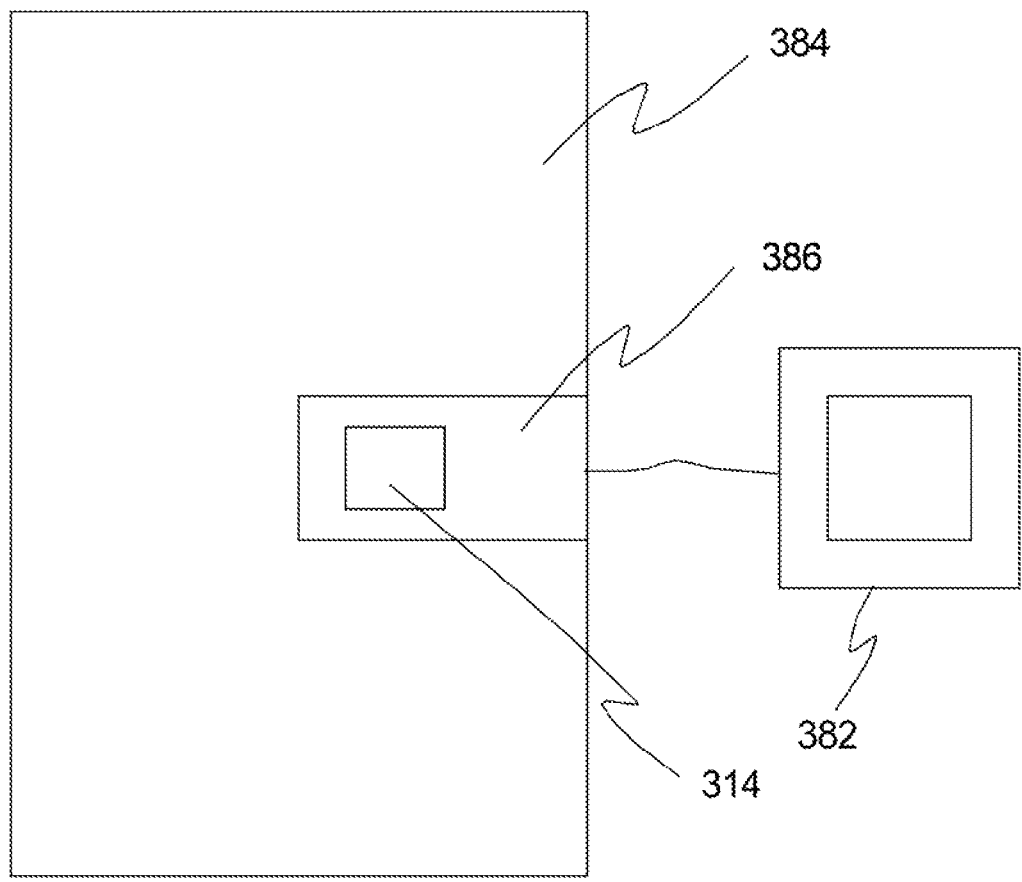
FIG. 3 is a simplified schematic illustration of a computer system, a media library and the digital data recovery system.

FIG. 3 is a simplified schematic illustration of one embodiment of a computer system 382 and a media library 384 that can be used with the digital data recovery system 314 described herein. The design of the computer system 382 can be varied. For example, in different embodiments, the computer system 382 can be a stand-alone computer, a computer network, or can another suitable type of computer system. As illustrated in this embodiment, the computer system 382 is hardwired to the media library 384 in order to provide a user interface with the media library 384. Alternatively, the computer system 382 can be wirelessly connected to the media library 384.

The design of the media library 384 can be varied. For example, in different embodiments, the media library 384 can be a disk library, a tape library, a virtual tape library, an optical disk library, or another suitable type of media library. As illustrated, the media library 384 can include one or more media drives 386 (only one media drive 386 is shown in FIG. 3). In non-exclusive embodiments, the media drives 386 can include one or more of a disk drive, a tape drive, a virtual tape drive, an optical drive, and/or some other type of media drive, or a combination of any of these drives.

The digital data recovery system 314, as discussed in detail herein, can be utilized to convert a suboptimal signal 18 (illustrated in FIG. 1) into a converted signal 20 (illustrated in FIG. 1) that more closely approximates an original signal 16 (illustrated in FIG. 1). In different embodiments, the digital data recovery system 314 can operate with any type of media or media drive.

As illustrated in FIG. 3, in one embodiment, the digital data recovery system 314 can be positioned substantially within the media drive 386. Alternatively, the digital data recovery system 314 can be positioned substantially within another portion of the media library 384, within the computer system 382, and/or positioned remotely from the media drive 386, the media library 384 and the computer system 382.

Figure 4:
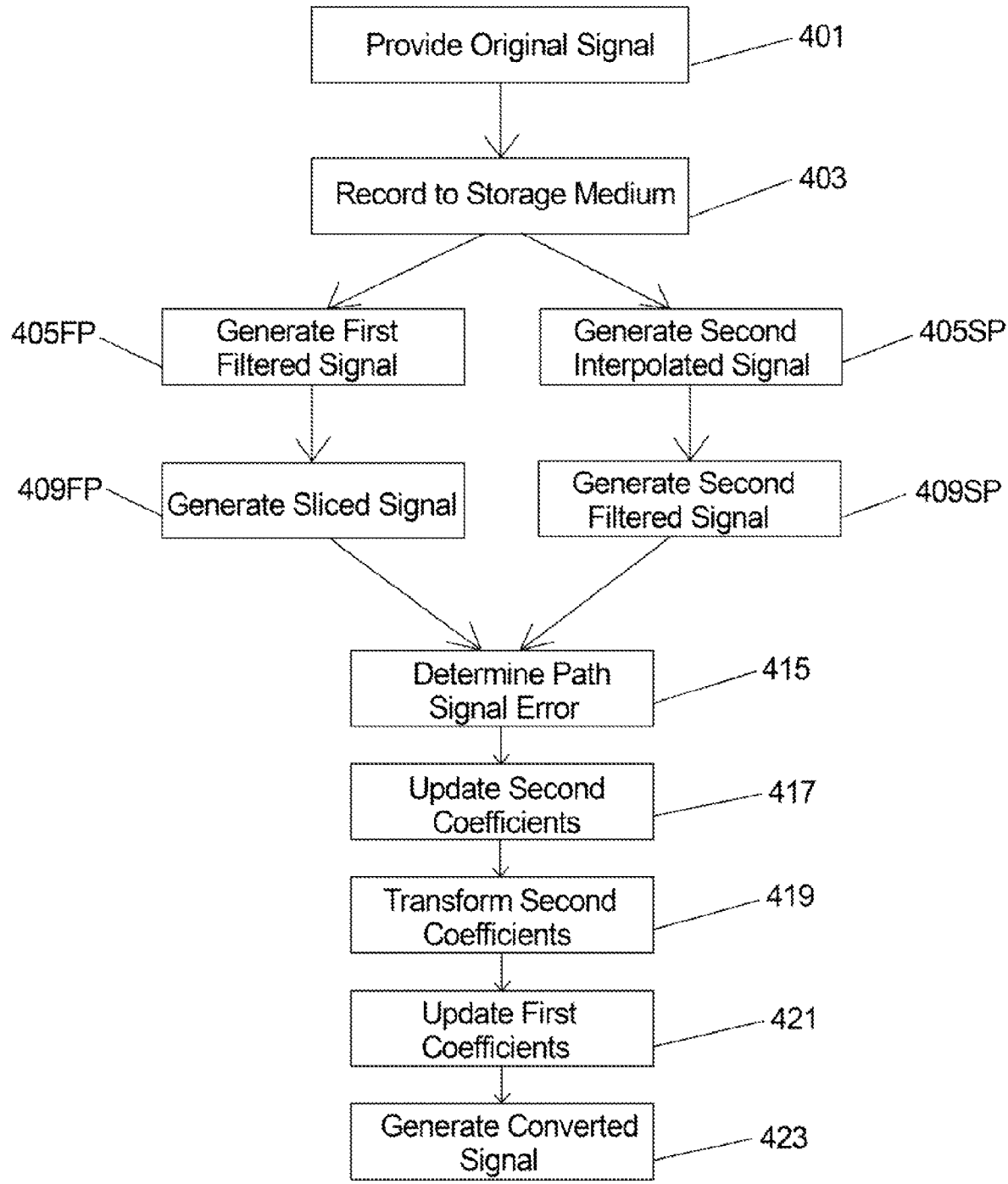
FIG. 4 is a simplified flow chart that outlines one embodiment of a process for recovering data with the digital data recovery system.

FIG. 4 is a simplified flow chart that outlines one embodiment of a process for recovering data with the digital data recovery system. Initially, in step 401, an original signal is obtained from an original signal source. Then, in step 403, the original signal is recorded onto a storage medium. Subsequently, when the signal is retrieved from the storage medium it has the characteristics and/or qualities of a suboptimal signal, i.e. the suboptimal signal includes noise, asymmetries and/or other impurities that were not included as part of the original signal. The suboptimal signal is then concurrently and/or substantially simultaneously directed on a first path, including at least one or more of steps 405FP and 409FP, as discussed below, and a second path, including at least one or more of steps 405SP and 409SP, as discussed below.

Along the first path, in step 405FP, the suboptimal signal is initially directed to a first data filter, wherein the suboptimal signal is converted into a first filtered signal. The first data filter utilizes a plurality of first coefficients during the process of converting the suboptimal signal into the first filtered signal. Subsequently, in step 409FP, the first filtered signal is directed to a timing recovery unit, wherein the first filtered signal is converted to a sliced signal through consecutive usage of a first interpolator and a slicer, utilizing feedback from additional features of the timing recovery unit.

Along the second path, in step 405SP, the suboptimal signal is initially directed to a second interpolator, wherein the suboptimal signal is converted into a second interpolated signal. Subsequently, in step 409SP, the second interpolated signal is directed to a second data filter, wherein the second interpolated signal is converted into a second filtered signal. The second data filter utilizes a plurality of second coefficients during the process of converting the second interpolated signal into the second filtered signal.

Next, in step 415, the sliced signal and the second filtered signal are substantially concurrently directed to a summing junction, wherein the sliced signal and the second filtered signal are compared to determine a path signal error. Subsequently, in step 417, the path signal error is fed back into the second data filter in order to update the plurality of second coefficients within the second data filter. Next, in step 419, the updated plurality of second coefficients are provided to a coefficient transformer, wherein the plurality of second coefficients are transformed so that the second coefficients are now in a format that is compatible with the plurality of first coefficients in the first data filter. Then, in step 421, the transformed coefficients are utilized to update the plurality of first coefficients in the first data filter. Finally, in step 423, the first data filter utilizes the updated plurality of first coefficients to convert the suboptimal signal in order to generate a converted signal, or output signal, that more closely approximates the original signal.

Figure 5:
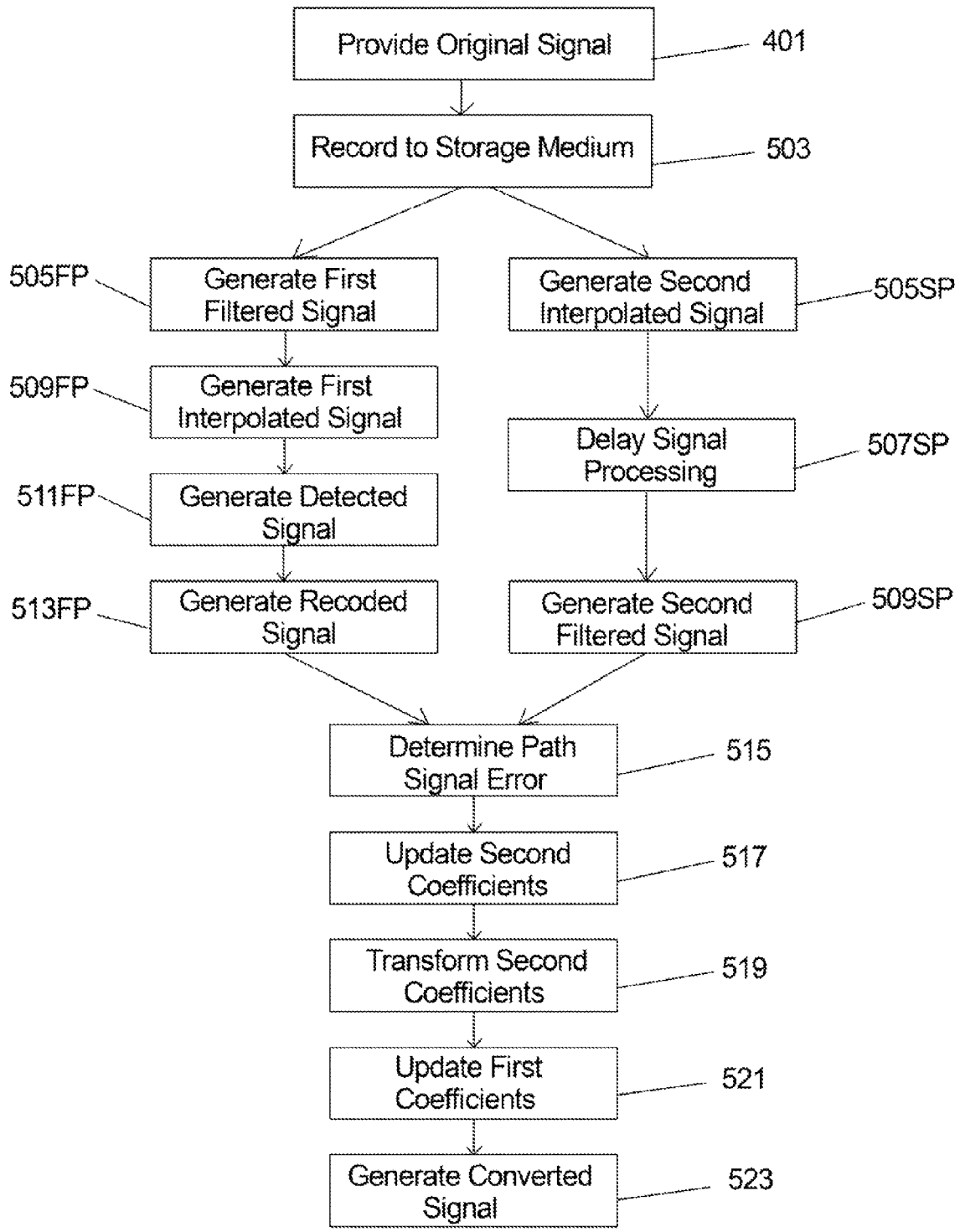
FIG. 5 is a simplified flow chart that outlines another embodiment of a process for recovering data with the digital data recovery system.

FIG. 5 is a simplified flow chart that outlines another embodiment of a process for recovering data with the digital data recovery system. Initially, in step 501, an original signal is obtained from an original signal source. Then, in step 503, the original signal is recorded onto a storage medium. Subsequently, when the signal is retrieved from the storage medium it has the characteristics and/or qualities of a suboptimal signal, i.e. the suboptimal signal includes noise, asymmetries and/or other impurities that were not included as part of the original signal. The suboptimal signal is then concurrently and/or substantially simultaneously directed on a first path and a second path, as discussed below.

Along the first path, in step 505FP, the suboptimal signal is initially directed to a first data filter, wherein the suboptimal signal is converted into a first filtered signal. The first data filter utilizes a plurality of first coefficients during the process of converting the suboptimal signal into the first filtered signal. Subsequently, in step 509FP, the first filtered signal is directed to a timing recovery unit, wherein the first filtered signal is converted to a first interpolated signal through usage of a first interpolator, utilizing feedback from additional features of the timing recovery unit. Next, in step 511FP, the first interpolated signal is directed to a detector, wherein the first interpolated signal is converted into a detected signal. Then, in step 513FP, the detected signal is directed to a recoder, wherein the detected signal is converted into a recoded signal.

Along the second path, in step 505SP, the suboptimal signal is initially directed to a second interpolator, wherein the suboptimal signal is converted into a second interpolated signal. Next, in step 507SP, the second interpolated signal is directed to a delay, wherein the processing of the second interpolated signal is delayed so as to more effectively match the timing of the processing of the first interpolated signal in the detector and the recoder. Subsequently, in step 509SP, the second interpolated signal is directed to a second data filter, wherein the second interpolated signal is converted into a second filtered signal. The second data filter utilizes a plurality of second coefficients during the process of converting the second interpolated signal into the second filtered signal.

Next, in step 515, the recoded signal and the second filtered signal are substantially concurrently directed to a summing junction, wherein the recoded signal and the second filtered signal are compared to determine a path signal error. Subsequently, in step 517, the path signal error is fed back into the second data filter in order to update the plurality of second coefficients within the second data filter. Next, in step 519, the updated plurality of second coefficients are provided to a coefficient transformer, wherein the plurality of second coefficients are transformed so that the second coefficients are now in a format that is compatible with the plurality of first coefficients in the first data filter. Then, in step 521, the transformed coefficients are utilized to update the plurality of first coefficients in the first data filter. Finally, in step 523, the first data filter utilizes the updated plurality of first coefficients to convert the suboptimal signal in order to generate a converted signal, or output signal, that more closely approximates the original signal.

While a number of exemplary aspects and embodiments of a digital data recovery system 14 have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. A digital data recovery system for converting a suboptimal signal into a converted signal that closely approximates an original signal, the digital data recovery system comprising:
   a first data filter that filters the suboptimal signal to generate a first filtered signal;
   a first interpolator that receives the first filtered signal and generates a first interpolated signal;
   a second interpolator that receives the suboptimal signal and generates second interpolated signal.

2. The digital data recovery system of claim 1 further comprising a second data filter that receives the second interpolated signal and generates a second filtered signal.

3. The digital data recovery system of claim 2 further comprising a slicer that receives the first interpolated signal and generates a sliced signal.

4. The digital data recovery system of claim 3 further comprising a summing junction that compares the second filtered signal and the sliced signal and determines a path signal error based on the difference between the second filtered signal and the sliced signal.

5. The digital data recovery system of claim 4 wherein the first data filter includes a set of first coefficients and the second data filter includes a set of second coefficients, wherein the path signal error is utilized to update the second coefficients, and wherein the second coefficients are transformed to update the first coefficients.

6. The digital data recovery system of claim 2 further comprising a detector that receives the first interpolated signal and generates a detected signal.

7. The digital data recovery system of claim 6 further comprising a recover that receives the detected signal and generates a recoded signal.

8. The digital data recovery system of claim 7 further comprising a summing junction that compares the second filtered signal and the recoded signal and determines a path signal error based on the difference between the second filtered signal and the recoded signal.

9. The digital data recovery system of claim 8 wherein the first data filter includes a set of first coefficients and the second data filter includes a set of second coefficients, wherein the path signal error is utilized to update the second coefficients, and wherein the second coefficients are transformed to update the first coefficients.

10. The digital data recovery system of claim 2 wherein the first data filter includes a set of first coefficients and the second data filter includes a set of second coefficients, and wherein the second coefficients are transformed to update the first coefficients.

11. A media library including a storage medium and the digital data recovery system of claim 1.

12. The media library of claim 11 wherein the media library is a tape library.

13. A media drive including the digital data recovery system of claim 1.

14. The media drive of claim wherein the media drive is a tape drive.

15. A method for converting a suboptimal signal into a converted signal that closely approximates an original signal, the method comprising the steps of:

directing the suboptimal signal along a first path including a first data filter and a first interpolator; and directing the suboptimal signal along a second path including a second data filter and a second interpolator, the second data filter being spaced apart from the first data filter.

16. The method of claim 15 wherein the suboptimal signal is directed along the second path substantially simultaneously with the suboptimal signal being directed along the first path.

17. The method of claim 15 wherein the suboptimal signal is directed to the first data filter prior to being directed to the first interpolator.

18. The method of claim 15 wherein the suboptimal signal is directed to the second interpolator prior to being directed to the second data filter.

19. The method of claim 15 wherein the step of directing the suboptimal signal along the first path includes the first data filter having a set of first coefficients, wherein the step of directing the suboptimal signal along the second path includes the second data filter having a set of second coefficients, and wherein the set of first coefficients are updated based at least in part on the set of second coefficients.

20. The method of claim 15 wherein the first path further includes a slicer, and further comprising the step of generating a sliced signal from the suboptimal signal by processing the suboptimal signal along the first path through the first data filter, the first interpolator and the slicer.

21. The method of claim 15 wherein the first path further includes a detector and a recoder, and further comprising the step of generating a recoded signal from the suboptimal signal by processing the suboptimal signal along the first path through the first data filter, the first interpolator, the detector and the recoder.

22. A method for converting a suboptimal signal into a converted signal that closely approximates an original signal, the method comprising the steps of:

directing the suboptimal signal along a first path including a first data filter, a first interpolator, and a slicer;

generating a sliced signal from the suboptimal signal by processing the suboptimal signal along the first path through the first data filter, the first interpolator and the slicer; and directing the suboptimal signal along a second path including a second data filter and a second interpolator.

23. The method of claim 22 further comprising the step of generating a second filtered signal from the suboptimal signal by processing the suboptimal signal along the second path through the second interpolator and the second data filter.

24. The method of claim 23 further comprising the step of determining a path signal error in a summing junction based on the difference between the second filtered signal and the sliced signal.

25. The method of claim 24 wherein the step of directing the suboptimal signal along the first path includes the first data filter having a set of first coefficients, wherein the step of directing the suboptimal signal along the second path includes the second data filter having a set of second coefficients, and further comprising the steps of updating the second coefficients with the path signal error, transforming the updated second coefficients into a format that is compatible with the first coefficients in a coefficient transformer, and updating the first coefficients with the transformed second coefficients.

26. A method for converting a suboptimal signal into a converted signal that closely approximates an original signal, the method comprising the steps of:

directing the suboptimal signal along a first path including a first data filter, a first interpolator, a detector and a recoder;

generating a recoded signal from the suboptimal signal by processing the suboptimal signal along the first path through the first data filter, the first interpolator, the detector and the recoder; and directing the suboptimal signal along a second path including a second data filter and a second interpolator.

27. The method of claim 26 further comprising the step of generating a second filtered signal from the suboptimal signal by processing the suboptimal signal along the second path through the second interpolator and the second data filter.

28. The method of claim 27 further comprising the step of determining a path signal error in a summing junction based on the difference between the second filtered signal and the recoded signal.

29. The method of claim 28 wherein the step of directing the suboptimal signal along the first path includes the first data filter having a set of first coefficients, wherein the step of directing the suboptimal signal along the second path includes the second data filter having a set of second coefficients, and further comprising the steps of updating the second coefficients with the path signal error, transforming the updated second coefficients into a format that is compatible with the first coefficients in a coefficient transformer, and updating the first coefficients with the transformed second coefficients.

30. A method for converting a suboptimal signal into a converted signal that closely approximates an original signal, the method comprising the steps of:

directing the suboptimal signal along a first path including a first data filter and a first interpolator, the first data filter having a set of first coefficients;

generating a first altered signal by processing the suboptimal signal along the first path through the first data filter and the first interpolator, the second data filter having a set of second coefficients;

directing the suboptimal signal along a second path including a second data filter and a second interpolator;

generating a second altered signal by processing the suboptimal signal along the second path through the second data filter and the second interpolator;

determining a path signal error in a summing junction based on the difference between the first altered signal and the second altered signal;

updating the second coefficients with the path signal error;

transforming the updated second coefficients into a format that is compatible with the first coefficients in a coefficient transformer; and updating the first coefficients with the transformed second coefficients.

31. A method for converting a suboptimal signal into a converted signal that closely approximates an original signal, the method comprising the steps of:

directing the suboptimal signal along a first path including a first data filter and a first interpolator; and directing the suboptimal signal along a second path including a second data filter and a second interpolator, the suboptimal signal being directed to the second interpolator prior to being directed to the second data filter.

32. A method for converting a suboptimal signal into a converted signal that closely approximates an original signal, the method comprising the steps of:

directing the suboptimal signal along a first path including a first data filter and a first interpolator, the first data filter having a set of first coefficients; and directing the suboptimal signal along a second path including a second data filter and a second interpolator, the second data filter having a set of second coefficients, wherein the set of first coefficients are updated based at least in part on the set of second coefficients.

* * * * *

UNITED STATES PATENT AND TRADEMARK OFFICE
CERTIFICATE OF CORRECTION

PATENT NO. : 8,433,965 B2  
APPLICATION NO. : 12/880740  
DATED : April 30, 2013  
INVENTOR(S) : Marc Feller Page 1 of 1

It is certified that error appears in the above-identified patent and that said Letters Patent is hereby corrected as shown below:

In the Claims

Column 14, Line 39, replace "recover" with --recoded--;

Column 14, Line 63, replace "claim wherein" with --claim 13 wherein--.

Signed and Sealed this  
Twenty-fifth Day of June, 2013

Teresa Stanek Rea  
*Acting Director of the United States Patent and Trademark Office*